(12) United States Patent
Sugiya et al.

(10) Patent No.: US 9,852,949 B2
(45) Date of Patent: Dec. 26, 2017

(54) WAFER PROCESSING METHOD

(71) Applicant: DISCO CORPORATION, Tokyo (JP)

(72) Inventors: Tetsukazu Sugiya, Tokyo (JP); Xin Lu, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/254,681

(22) Filed: Sep. 1, 2016

(65) Prior Publication Data

US 2017/0069537 A1    Mar. 9, 2017

(30) Foreign Application Priority Data

Sep. 8, 2015 (JP) .................. 2015-176943

(51) Int. Cl.
*H01L 21/78* (2006.01)
*H01L 21/268* (2006.01)
(Continued)

(52) U.S. Cl.
CPC ............... *H01L 21/78* (2013.01); *B28D 5/00* (2013.01); *B28D 5/02* (2013.01); *H01L 21/268* (2013.01); *H01L 21/304* (2013.01); *H01L 21/3043* (2013.01); *H01L 21/31058* (2013.01); *H01L 21/561* (2013.01); *H01L 21/67092* (2013.01);
(Continued)

(58) Field of Classification Search
CPC ..... H01L 21/78; H01L 21/268; H01L 21/304; H01L 21/3043; H01L 21/31058; H01L 21/565; H01L 21/67092; H01L 23/3114; H01L 23/544; H01L 2223/5446; H01L 21/782; H01L 21/784; H01L 21/786; H01L 41/337; H01L 21/02013; H01L 2221/68327; H01L 2224/03602; H01L 2224/11602; H01L 2224/27602; H01L 21/463; H01L 21/6836; B28D 5/00; B28D 5/02; B23K 2201/40; B23K 26/364
See application file for complete search history.

(56) References Cited

U.S. PATENT DOCUMENTS 6,649,445 B1 * 11/2003 Qi ..................... H01L 24/29
                                              257/E21.237
6,657,282 B2 * 12/2003 Fukasawa ........... H01L 21/56
                                              257/618
(Continued)

FOREIGN PATENT DOCUMENTS

JP         2006-100535        4/2006

*Primary Examiner* — Scott B Geyer
(74) *Attorney, Agent, or Firm* — Greer Burns & Crain Ltd.

(57) ABSTRACT

A wafer is divided into device chips each of which is surrounded by a mold resin. The wafer has a plurality of devices arranged like a matrix with a spacing having a predetermined width, the front side of each device being covered with the mold resin, the spacing being filled with the mold resin to form a street between any adjacent ones of the devices. The wafer processing method includes a division start point forming step of forming a division start point along each street at the lateral center of the mold resin filling the spacing and a dividing step of applying an external force to the wafer after performing the division start point forming step, thereby laterally dividing each street into two parts at the division start point to obtain the device chips divided from each other, each device chip being surrounded by the mold resin.

4 Claims, 14 Drawing Sheets

(51) Int. Cl.
    *H01L 21/304*     (2006.01)
    *H01L 21/3105*     (2006.01)
    *H01L 21/67*     (2006.01)
    *B28D 5/00*     (2006.01)
    *B28D 5/02*     (2006.01)
    *H01L 21/56*     (2006.01)
    *H01L 21/683*     (2006.01)
    *H01L 23/31*     (2006.01)

(52) U.S. Cl.
    CPC ...... *H01L 21/6836* (2013.01); *H01L 23/3114* (2013.01); *H01L 2221/6834* (2013.01); *H01L 2221/68327* (2013.01)

(56) References Cited

U.S. PATENT DOCUMENTS

| | | | |
|---|---|---|---|
| 6,908,784 B1 * | 6/2005 | Farnworth | H01L 21/3043 257/E21.237 |
| 8,367,475 B2 * | 2/2013 | Law | H01L 24/81 438/113 |
| 9,466,585 B1 * | 10/2016 | Kamphuis | H01L 24/94 |
| 9,508,623 B2 * | 11/2016 | Suthiwongsunthorn | H01L 21/6836 |
| 2005/0059325 A1 * | 3/2005 | Nagai | B24B 37/042 451/41 |
| 2006/0275949 A1 * | 12/2006 | Farnworth | H01L 21/3043 438/106 |
| 2008/0132035 A1 * | 6/2008 | Kondo | H01L 21/3043 438/463 |
| 2014/0091482 A1 * | 4/2014 | Lin | H01L 24/11 257/782 |
| 2014/0252643 A1 * | 9/2014 | Abe | B23K 26/0057 257/773 |

* cited by examiner

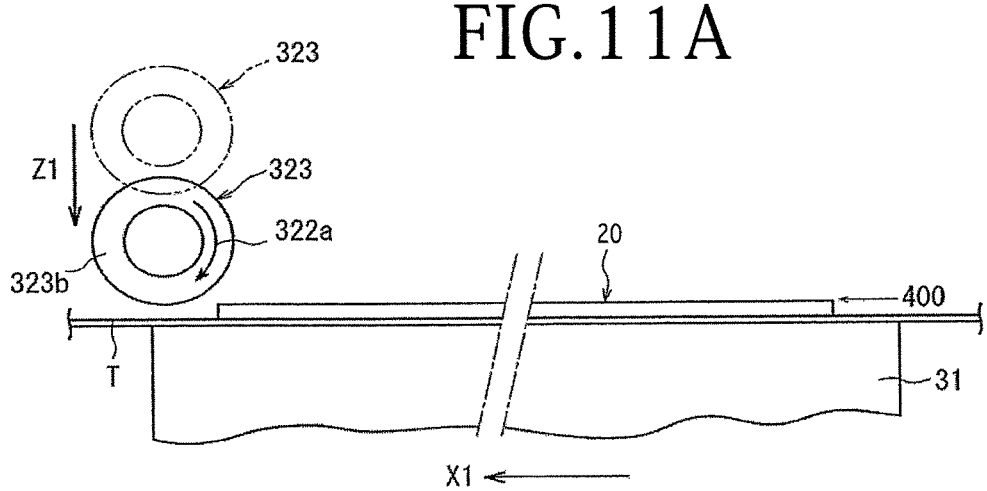
FIG.11A
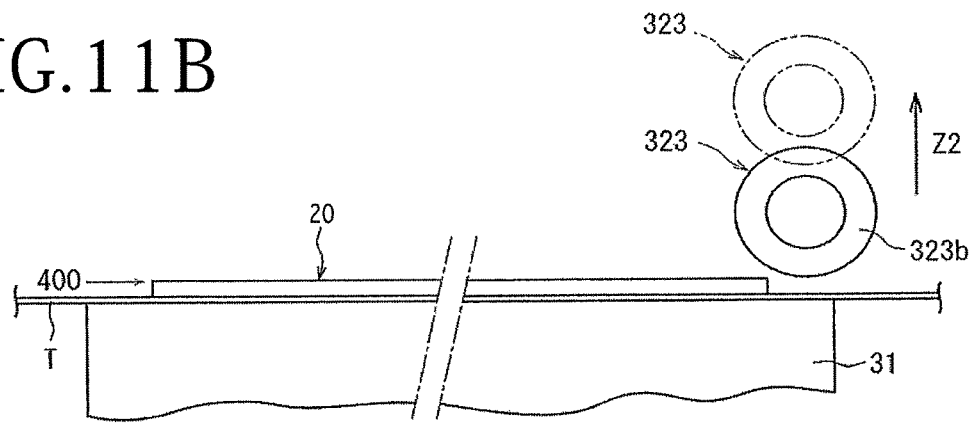
FIG.11B
FIG.11C
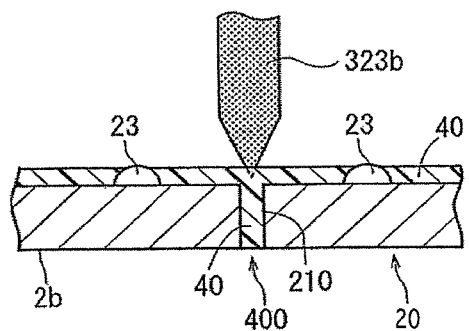
FIG.11D
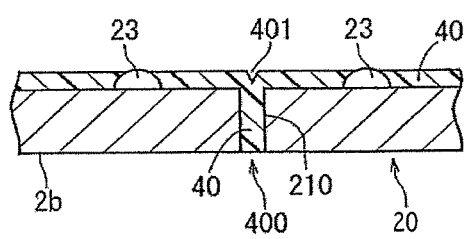

WAFER PROCESSING METHOD

BACKGROUND OF THE INVENTION

Field of the Invention

The present invention relates to a wafer processing method for dividing a wafer into a plurality of individual device chips along a plurality of crossing division lines and covering each device chip with a resin, the division lines being formed on the front side of the wafer to thereby define a plurality of separate regions where a plurality of devices corresponding to the device chips are each formed.

Description of the Related Art

In a semiconductor device fabrication process, a plurality of crossing division lines are formed on the front side of a substantially disk-shaped semiconductor wafer to thereby define a plurality of separate regions where a plurality of devices such as integrated circuits (ICs) and large-scale integration (LSI) circuits are each formed. These regions are divided from each other by cutting the semiconductor wafer along the division lines, thereby producing a plurality of individual device chips each corresponding to the devices.

In recent years, there have been developed packaging techniques of dividing a wafer into individual device chips and covering each device chip with a resin. A packaging technique called wafer level chip size package (WLCSP) as one of the above-mentioned packaging techniques is disclosed in Japanese Patent Laid-open No. 2006-100535.

The packaging technique disclosed in Japanese Patent Laid-open No. 2006-100535 includes the steps of covering the back side of a wafer with a resin, forming a cut groove on the front side of the wafer along each division line, the cut groove having a depth reaching the resin covering the back side of the wafer, applying a mold resin to the front side of the wafer to cover each device with the mold resin and fill each cut groove with the mold resin, and cutting the mold resin filling each cut groove by using a cutting blade having a thickness smaller than the width of each cut groove, thereby dividing the wafer into individual WLCSPs.

Further, as a wafer processing method for manufacturing such WLCSPs, the following technique has been developed.
(1) A cut groove having a depth corresponding to the finished thickness of each device chip is formed on the front side of a wafer along each division line.
(2) A mold resin is applied to the front side of the wafer so as to fully cover the front side of the wafer with the mold resin and fill each cut groove with the mold resin.
(3) A protective member is attached to the front side of the mold resin covering the front side of the wafer, and the back side of the wafer is next ground to expose the bottom of each cut groove to the back side of the wafer.
(4) A dicing tape is attached to the back side of the wafer, and the mold resin filling each cut groove is cut by using a cutting blade having a thickness smaller than the width of each cut groove, thereby dividing the wafer into individual WLCSPs.

SUMMARY OF THE INVENTION

However, both of these processing methods mentioned above have the following problem. When the mold resin filling each cut groove is cut by the cutting blade, the cutting edge of the cutting blade may be deformed by the resistance of the mold resin, causing damage to the side surface of each device surrounded by the mold resin, constituting each WLCSP.

It is therefore an object of the present invention to provide a wafer processing method which can obtain a good-quality device surrounded by a mold resin.

In accordance with an aspect of the present invention, there is provided a wafer processing method for dividing a wafer into device chips each of which is surrounded by a mold resin, the wafer having a plurality of devices arranged like a matrix with a spacing having a predetermined width, the front side of each device being covered with the mold resin, the spacing being filled with the mold resin to form a street between any adjacent ones of the devices, the wafer processing method including a division start point forming step of forming a division start point along each street at the lateral center of the mold resin filling the spacing; and a dividing step of applying an external force to the wafer after performing the division start point forming step, thereby laterally dividing each street into two parts at the division start point to obtain the device chips divided from each other, each device chip being surrounded by the mold resin.

Preferably, the wafer is manufactured by a method including an original wafer preparing step of preparing an original wafer having a front side on which a plurality of crossing division lines are formed to thereby define a plurality of separate regions where the devices are each formed; a groove forming step of forming a groove having a depth corresponding to the finished thickness of each device chip on the front side of the original wafer along each division line, after performing the original wafer preparing step; a molding step of applying the mold resin to the front side of the original wafer so as to fully cover the front side and fill the groove formed on the front side along each division line, after performing the groove forming step; and a back grinding step of grinding the back side of the original wafer after performing the molding step, thereby exposing the bottom of each groove to expose the mold resin filling each groove to the back side of the original wafer.

Preferably, the division start point to be formed in the division start point forming step includes a cut groove to be formed by a cutting blade. As a modification, the division start point to be formed in the division start point forming step includes a scribed groove to be formed by a scriber. As another modification, the division start point to be formed in the division start point forming step includes a laser processed groove to be formed by laser processing.

According to the wafer processing method of the present invention, a cutting blade is not used to divide the wafer along each street at the lateral center of the mold resin filling the spacing of the wafer. As a result, it is possible to solve the problem that the cutting edge of the cutting blade may be deformed to cause damage to the side surface of each device in cutting the mold resin.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 11A to 11D are views for illustrating the first preferred embodiment of the division start point forming step;

DETAILED DESCRIPTION OF THE PREFERRED EMBODIMENTS

A preferred embodiment of the wafer processing method according to the present invention will now be described in detail with reference to the attached drawings. First, a method of manufacturing a wafer to be processed by the wafer processing method according to the present invention will now be described with reference to FIGS. 1 to 8B. This wafer has a plurality of devices arranged like a matrix with a spacing having a predetermined width, the front side of each device being covered with a mold resin, the spacing being filled with the mold resin to form a street between any adjacent ones of the plural devices.

Figure 1:
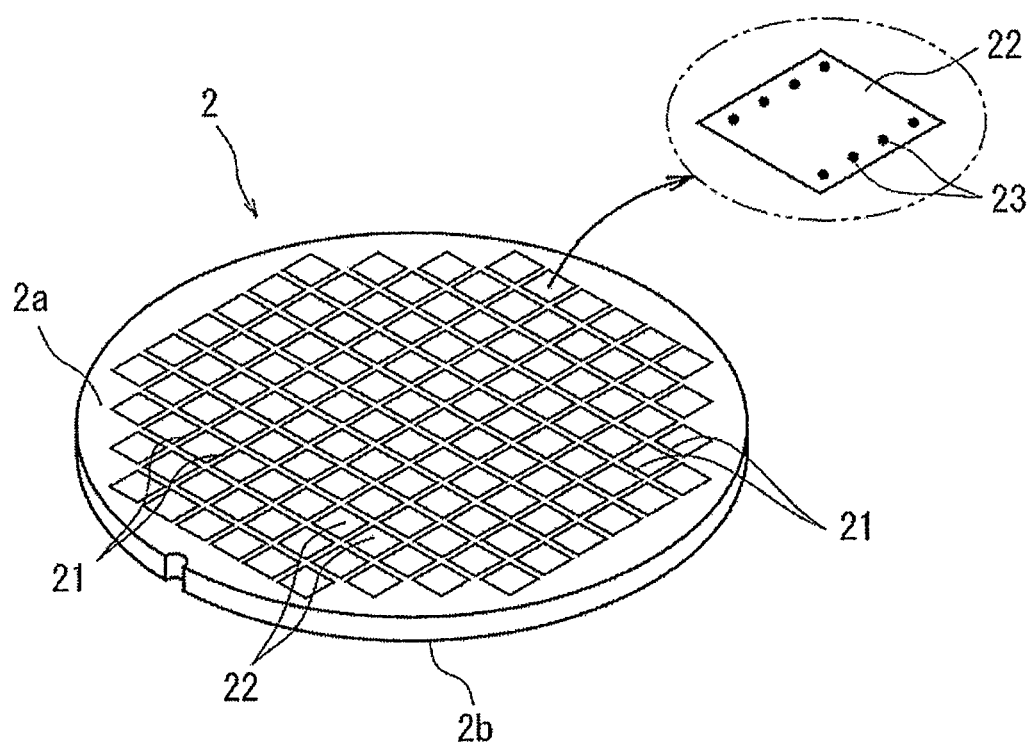
FIG. 1 is a perspective view of a semiconductor wafer.

FIG. 1 is a perspective view of a semiconductor wafer 2 (original wafer) for use in manufacturing the wafer to be processed by the wafer processing method according to the present invention. The semiconductor wafer 2 shown in FIG. 1 is a silicon wafer having a thickness of 700 μm, for example. The semiconductor wafer 2 has a front side 2a and a back side 2b. A plurality of crossing division lines 21 are formed on the front side 2a of the semiconductor wafer 2, and a plurality of devices 22 such as ICs and LSIs are each formed in a plurality of separate regions defined by the plural division lines 21. All of these devices 22 have the same configuration. A plurality of bumps 23 as projection electrodes are formed on the front side of each device 22. There will now be described a wafer processing method including the steps of dividing the semiconductor wafer 2 along the division lines 21 to obtain individual device chips with a spacing having a predetermined width, covering the front side of each device chip with a mold resin, and filling the spacing with the mold resin.

First, a groove forming step is performed in such a manner that a groove having a predetermined width and a depth corresponding to the finished thickness of each device chip is formed on the front side 2a of the semiconductor wafer 2 along each division line 21. This groove forming step is performed by using a cutting apparatus 3 shown in FIG. 2. The cutting apparatus 3 shown in FIG. 2 includes a chuck table 31 for holding a workpiece, cutting means 32 for cutting the workpiece held on the chuck table 31, and imaging means 33 for imaging the workpiece held on the chuck table 31. The chuck table 31 is adapted to hold the workpiece under suction. The chuck table 31 is movable in a feeding direction shown by an arrow X in FIG. 2 by operating feeding means (not shown). The chuck table 31 is also movable in an indexing direction shown by an arrow Y in FIG. 2 by operating indexing means (not shown).

The cutting means 32 includes a spindle housing 321 extending in a substantially horizontal direction, a rotating spindle 322 rotatably supported to the spindle housing 321, and a cutting blade 323 mounted on a front end portion of the rotating spindle 322. The cutting blade 323 has an annular cutting edge 323a. The rotating spindle 322 is rotatable in the direction shown by an arrow 322a by operating a servo motor (not shown) provided in the spindle housing 321. In this preferred embodiment, the annular cutting edge 323a of the cutting blade 323 has a thickness of 40 μm. The imaging means 33 is mounted on a front end portion of the spindle housing 321. The imaging means 33 is configured by optical means including a microscope and a charge-coupled device (CCD) camera. An image signal output from the imaging means 33 is transmitted to control means (not shown).

In performing the groove forming step by using the cutting apparatus 3, the semiconductor wafer 2 is placed on the chuck table 31 in the condition where the back side 2b of the semiconductor wafer 2 is in contact with the upper surface of the chuck table 31. Thereafter, suction means (not shown) is operated to hold the semiconductor wafer 2 on the chuck table 31 under suction. Accordingly, the semiconductor wafer 2 is held on the chuck table 31 in the condition where the front side 2a of the semiconductor wafer 2 is oriented upward. After holding the semiconductor wafer 2 on the chuck table 31 under suction as described above, the chuck table 31 is moved to a position directly below the imaging means 33 by operating the feeding means (not shown) mentioned above.

In the condition where the chuck table 31 holding the semiconductor wafer 2 is positioned directly below the imaging means 33, an alignment operation is performed by the imaging means 33 and the control means (not shown) to detect a cutting area where a division groove is to be formed along each division line 21 on the front side 2a of the semiconductor wafer 2. More specifically, the imaging means 33 and the control means (not shown) perform image processing such as pattern matching for making the alignment between the division lines 21 extending in a first direction on the semiconductor wafer 2 and the cutting blade 323 for cutting the semiconductor wafer 2 along the division lines 21, thereby performing the alignment for the cutting area (alignment step). Similarly, the alignment step is performed for the other division lines 21 extending in a second direction perpendicular to the first direction on the semiconductor wafer 2.

Figure 3A:
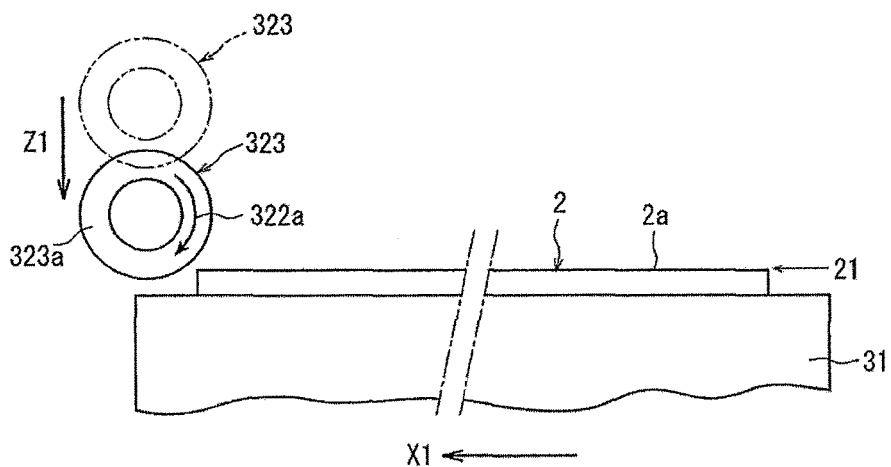
FIGS. 3A to 3D are views for illustrating the groove forming step.
Figure 3B:
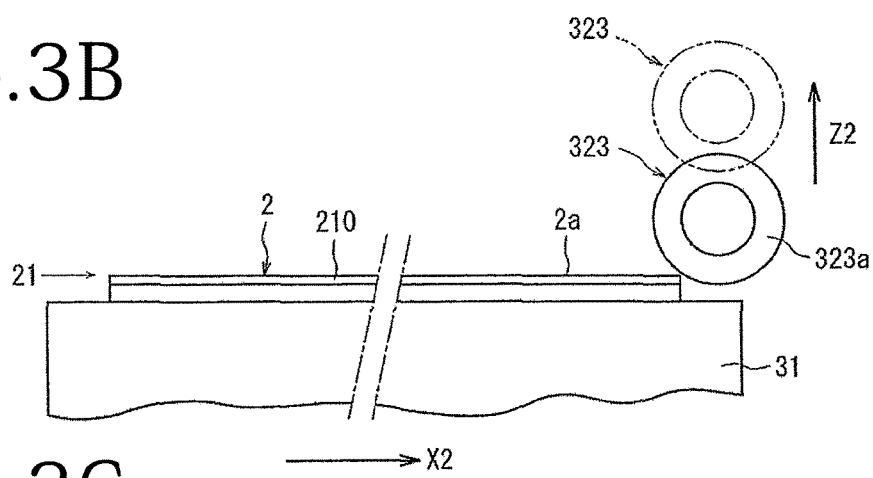
Figure 3C:
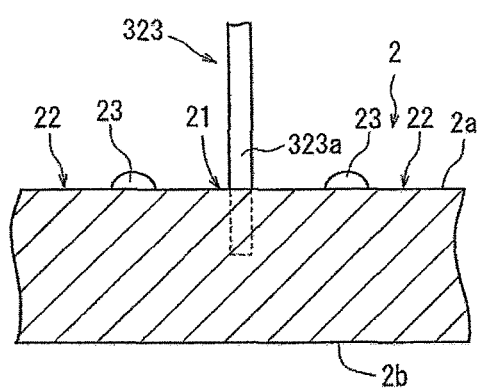

After performing the alignment step to detect all of the division lines 21 of the semiconductor wafer 2 held on the chuck table 31, the chuck table 31 holding the semiconductor wafer 2 is moved to a cutting start position in the cutting area. At the cutting start position, one end (left end as viewed in FIG. 3A) of a predetermined one of the division lines 21 extending in the first direction is set on the right side of a position directly below the annular cutting edge 323a of the cutting blade 323 by a predetermined amount as shown in FIG. 3A. Thereafter, the cutting blade 323 is lowered as shown by an arrow Z1 from a standby position shown by a phantom line in FIG. 3A to a working position shown by a solid line in FIG. 3A. As shown in FIGS. 3A and 3C, this working position is set so that the lower end of the annular cutting edge 323a of the cutting blade 323 is positioned at a predetermined depth (e.g., 300 μm) from the front side 2a of the semiconductor wafer 2, which depth corresponds to the finished thickness of each device chip.

Figure 3D:
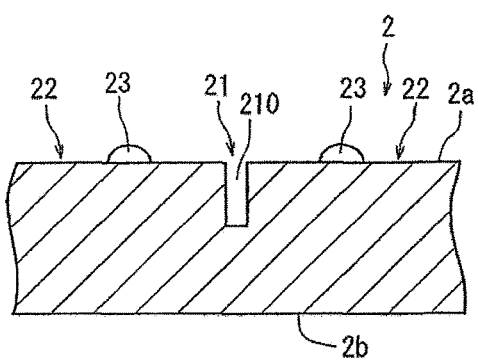

Thereafter, the cutting blade 323 is rotated at a predetermined speed in the direction of the arrow 322a shown in FIG. 3A, and the chuck table 31 is moved at a predetermined feed speed in the direction shown by an arrow X1 in FIG. 3A. When the other end (right end as viewed in FIG. 3B) of the predetermined division line 21 reaches the left side of the position directly below the annular cutting edge 323a of the cutting blade 323 by a predetermined amount as shown in FIG. 3B, the movement of the chuck table 31 is stopped. By feeding the chuck table 31 as rotating the cutting blade 323 in this manner, the semiconductor wafer 2 is cut along the predetermined division line 21 to form a groove 210 on the front side 2a of the semiconductor wafer 2 along the predetermined division line 21 as shown in FIG. 3D, wherein the groove 210 has a width of 40 μm and a depth (e.g., 300 μm) corresponding to the finished thickness of each device chip (groove forming step).

Thereafter, the cutting blade 323 is raised as shown by an arrow Z2 from the working position shown by a solid line in FIG. 3B to the standby position shown by a phantom line in FIG. 3B, and the chuck table 31 is next moved in the direction shown by an arrow X2 in FIG. 3B to restore the position shown in FIG. 3A. Thereafter, the chuck table 31 is indexed in the direction (indexing direction) perpendicular to the sheet plane of FIG. 3A by an amount corresponding to the pitch of the division lines 21, thereby positioning the next division line 21 in alignment with the cutting blade 323. In the condition where the next division line 21 is aligned with the cutting blade 323, the groove forming step mentioned above is performed along the next division line 21. Thereafter, the groove forming step mentioned above is similarly performed along all of the other division lines 21 extending in the first direction. Thereafter, the chuck table 31 is rotated 90 degrees to similarly perform the groove forming step along all of the division lines 21 extending in the second direction perpendicular to the first direction. As a result, a plurality of grooves 210 are formed along all of the division lines 21 extending in the first and second directions.

Figure 4A:
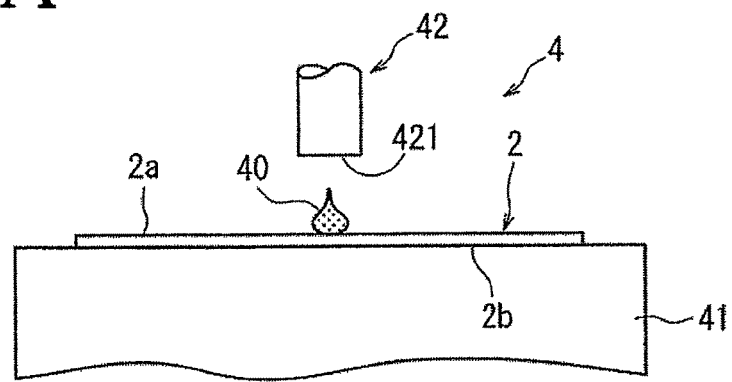
FIGS. 4A to 4C are views for illustrating a molding step.

After performing the groove forming step mentioned above, a molding step is performed in such a manner that a mold resin is applied to the front side 2a of the semiconductor wafer 2 so as to fully cover the front side 2a and fill the grooves 210 formed on the front side 2a. This molding step is performed by using a resin molding apparatus 4 shown in FIG. 4A. The resin molding apparatus 4 shown in FIG. 4A includes a holding table 41 for holding the semiconductor wafer 2 and a resin supply nozzle 42 having a nozzle opening 421 for supplying a mold resin 40 to the front side 2a of the semiconductor wafer 2 held on the holding table 41. In performing the molding step, the semiconductor wafer 2 is placed on the holding table 41 in the condition where the back side 2b of the semiconductor wafer 2 is in contact with the upper surface (holding surface) of the holding table 41. Thereafter, suction means (not shown) is operated to hold the semiconductor wafer 2 on the holding surface of the holding table 41 under suction. Accordingly, the semiconductor wafer 2 is held on the holding table 41 in the condition where the front side 2a of the semiconductor wafer 2 is oriented upward. After holding the semiconductor wafer 2 on the holding table 41 in this manner, the nozzle opening 421 of the resin supply nozzle 42 is positioned directly above the center of the semiconductor wafer 2 held on the holding table 41 as shown in FIG. 4A. Thereafter, resin supply means (not shown) is operated to drop the mold resin 40 by a predetermined amount from the nozzle opening 421 of the resin supply nozzle 42 to the central area of the front side 2a of the semiconductor wafer 2 held on the holding table 41.

Figure 4B:
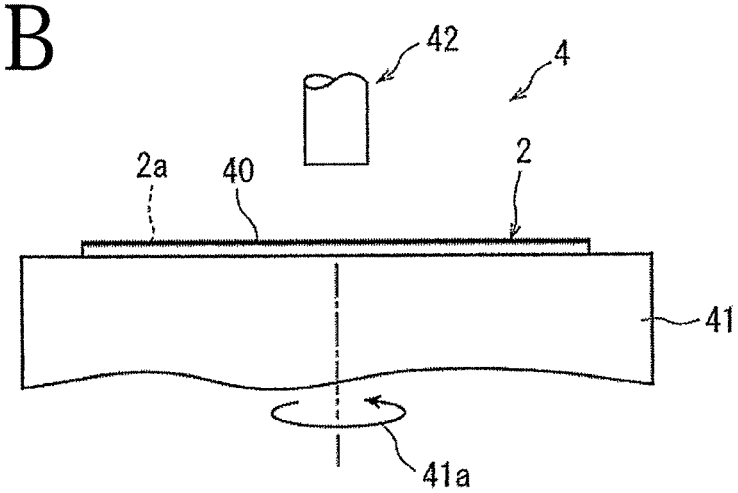
Figure 4C:
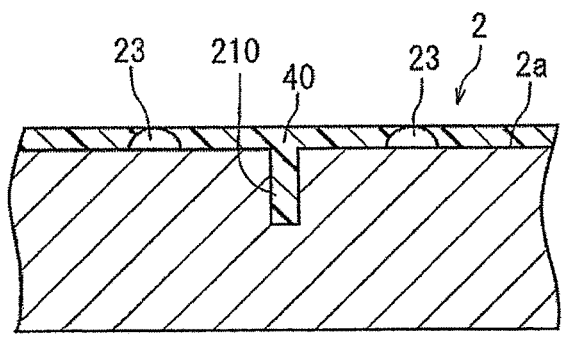

After dropping the mold resin 40 by the predetermined amount to the central area of the front side 2a of the semiconductor wafer 2, the holding table 41 is rotated in the direction shown by an arrow 41a in FIG. 4B at a predetermined speed for a predetermined period of time, thereby applying the mold resin 40 to the front side 2a of the semiconductor wafer 2 so as to fully cover the front side 2a with the mold resin 40 and fill the grooves 210 with the mold resin 40. The layer of the mold resin 40 covering the front side 2a of the semiconductor wafer 2 has a thickness of 100 μm, for example. In this preferred embodiment, the mold resin 40 is a mixture obtained by mixing silica particles in a thermosetting liquid resin (epoxy resin). After applying the mold resin 40 to the front side 2a of the semiconductor wafer 2 so as to fully cover the front side 2a with the mold resin 40 and fill the grooves 210 with the mold resin 40, the semiconductor wafer 2 is heated to approximately 150° C. to thereby set the mold resin 40. The particle size of the silica particles to be mixed in the liquid resin (epoxy resin) is set to less than or equal to ½ of the width of each groove 210. The volume ratio of the silica particles to the liquid resin is set to 90% so that the expansion coefficient of the mold resin 40 becomes equal to that of the semiconductor wafer 2.

After performing the molding step mentioned above, a bump exposing step is performed in such a manner that the mold resin 40 covering the front side 2a of the semiconductor wafer 2 is polished to expose the bumps 23 formed on the front side of each device 22. This bump exposing step is performed by using a polishing apparatus 5 shown in FIG. 5A. The polishing apparatus 5 shown in FIG. 5A includes a chuck table 51 for holding a workpiece and polishing means 52 for polishing the workpiece held on the chuck table 51. The chuck table 51 has an upper surface as a holding surface for holding the workpiece under suction. The chuck table 51 is rotatable in the direction shown by an arrow 51a in FIG. 5A by a rotational drive mechanism (not shown). The polishing means 52 includes a spindle housing 521, a rotating spindle 522 rotatably supported to the spindle housing 521 and adapted to be rotated by a rotational drive mechanism (not shown), a mounter 523 fixed to the lower end of the rotating spindle 522, and a polishing tool 524 mounted on the lower surface of the mounter 523. The polishing tool 524 is composed of a circular base 525 and a polishing pad 526 fixed to the lower surface of the circular base 525. The circular base 525 is mounted on the lower surface of the mounter 523 by a plurality of fastening bolts 527. In this preferred embodiment, the polishing pad 526 is a component obtained by mixing silica abrasive grains as a polishing material in a felt.

Figure 5A:
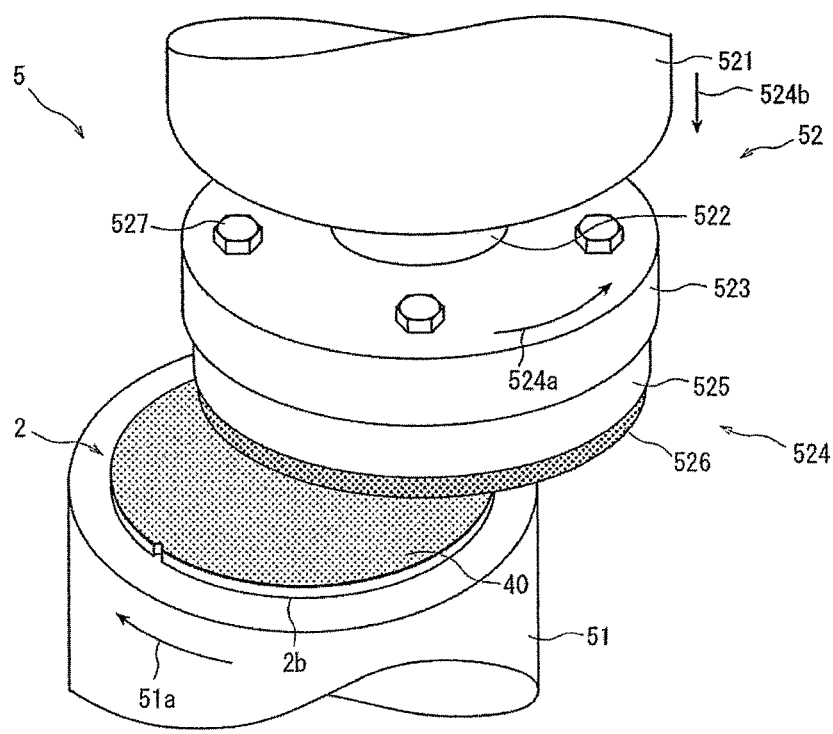
FIGS. 5A to 5C are views for illustrating a bump exposing step.
Figure 5B:
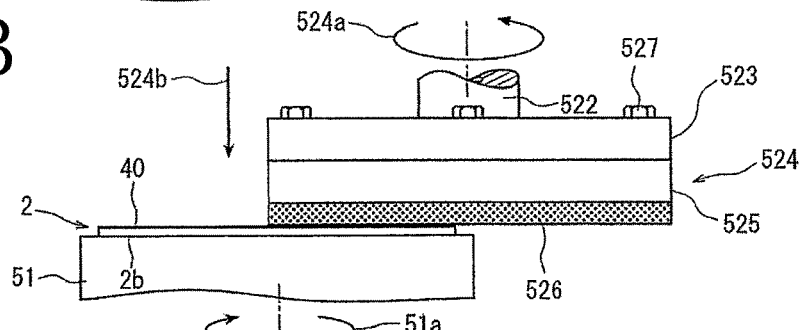
Figure 5C:
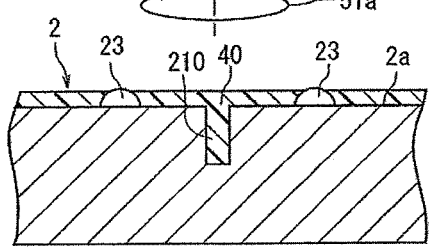

In performing the bump exposing step by using the polishing apparatus 5 mentioned above, the semiconductor wafer 2 is placed on the chuck table 51 in the condition where the back side 2b of the semiconductor wafer 2 is in contact with the upper surface (holding surface) of the chuck table 51 as shown in FIG. 5A. Thereafter, suction means (not shown) is operated to hold the semiconductor wafer 2 on the chuck table 51 under suction (wafer holding step). Accordingly, the semiconductor wafer 2 is held on the chuck table 51 in the condition where the mold resin 40 covering the front side 2a of the semiconductor wafer 2 is oriented upward. After holding the semiconductor wafer 2 on the chuck table 51 under suction in this manner, the chuck table 51 is rotated in the direction of the arrow 51a in FIG. 5A at a predetermined speed. At the same time, the polishing tool 524 of the polishing means 52 is also rotated in the direction shown by an arrow 524a in FIG. 5A at a predetermined speed. Thereafter, the polishing means 52 is lowered to bring the polishing pad 526 of the polishing tool 524 into contact with the upper surface (work surface) of the mold resin 40 covering the front side 2a of the semiconductor wafer 2. Thereafter, the polishing pad 524 is fed (lowered) in the direction shown by an arrow 524b in FIGS. 5A and 5B (in the direction perpendicular to the holding surface of the chuck table 51) by a predetermined amount at a predetermined feed speed. As a result, the upper surface of the mold resin 40 covering the front side 2a of the semiconductor wafer 2 is polished to thereby expose the bumps 23 formed on the front side of each device 22 as shown in FIG. 5C.

As a modification, in the molding step, the mold resin 40 may be applied to the front side 2a of the semiconductor wafer 2 so as not to cover the bumps 23. In this case, the bump exposing step is not necessarily required.

Figure 6A:
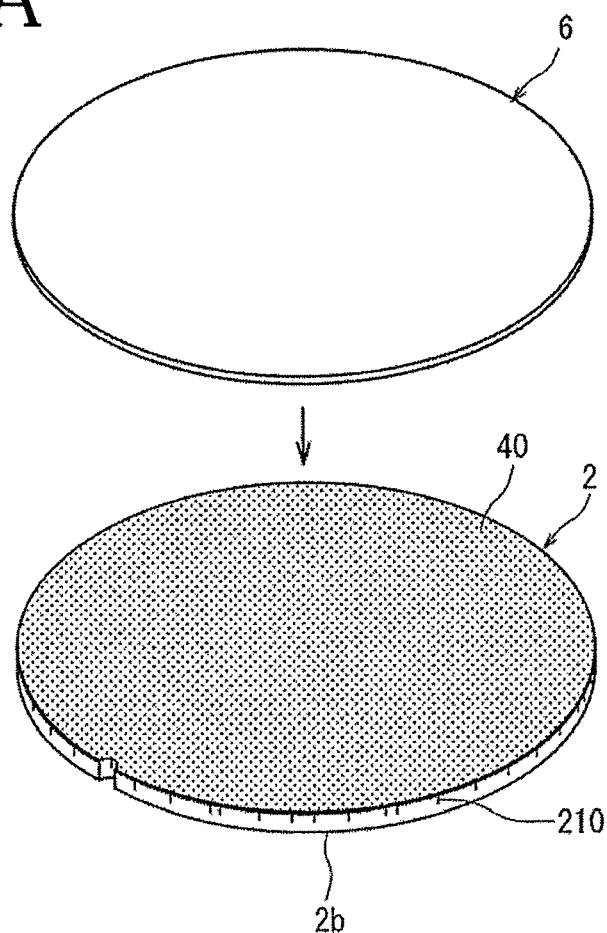
FIGS. 6A and 6B are perspective views for illustrating a protective member attaching step.
Figure 6B:
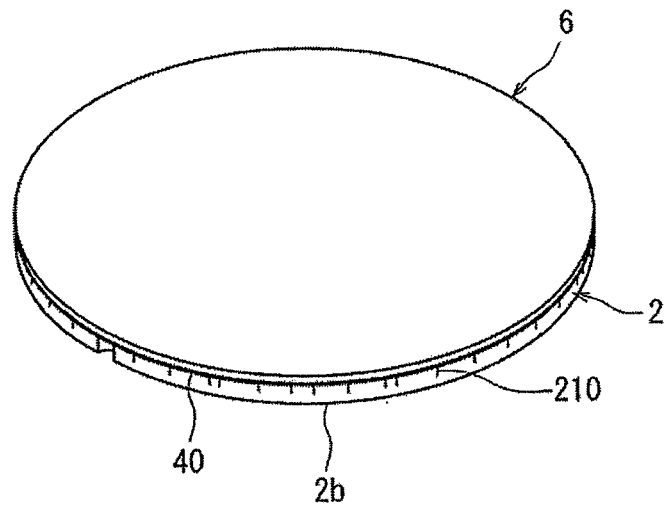

After performing the bump exposing step mentioned above, a protective member attaching step is performed in such a manner that a protective member is attached to the upper surface of the mold resin 40 covering the front side 2a of the semiconductor wafer 2. More specifically, as shown in FIGS. 6A and 6B, a protective tape 6 as the protective member is attached to the upper surface of the mold resin 40 covering the front side 2a of the semiconductor wafer 2. In this preferred embodiment, the protective tape 6 is composed of a base sheet and an adhesive layer formed on the front side of the base sheet. The base sheet is formed of polyvinyl chloride (PVC) and has a thickness of 100 µm. The adhesive layer is formed of acrylic resin and has a thickness of approximately 5 µm.

After performing the protective member attaching step mentioned above, a back grinding step is performed in such a manner that the back side 2b of the semiconductor wafer 2 is ground to expose the bottom of each division groove 210, thereby exposing the mold resin 40 filling each division groove 210 to the back side 2b of the semiconductor wafer 2. This back grinding step is performed by using a grinding apparatus 7 shown in FIG. 7A. The grinding apparatus 7 shown in FIG. 7A includes a chuck table 71 for holding a workpiece and grinding means 72 for grinding the workpiece held on the chuck table 71. The chuck table 71 has an upper surface as a holding surface for holding the workpiece under suction. The chuck table 71 is rotatable in the direction shown by an arrow 71a in FIG. 7A by a rotational drive mechanism (not shown). The grinding means 72 includes a spindle housing 721, a rotating spindle 722 rotatably supported to the spindle housing 721 and adapted to be rotated by a rotational drive mechanism (not shown), a mounter 723 fixed to the lower end of the rotating spindle 722, and a grinding wheel 724 mounted on the lower surface of the mounter 723. The grinding wheel 724 is composed of an annular base 725 and a plurality of abrasive members 726 fixed to the lower surface of the annular base 725 so as to be annularly arranged along the outer circumference thereof. The annular base 725 is mounted on the lower surface of the mounter 723 by a plurality of fastening bolts 727.

Figure 7A:
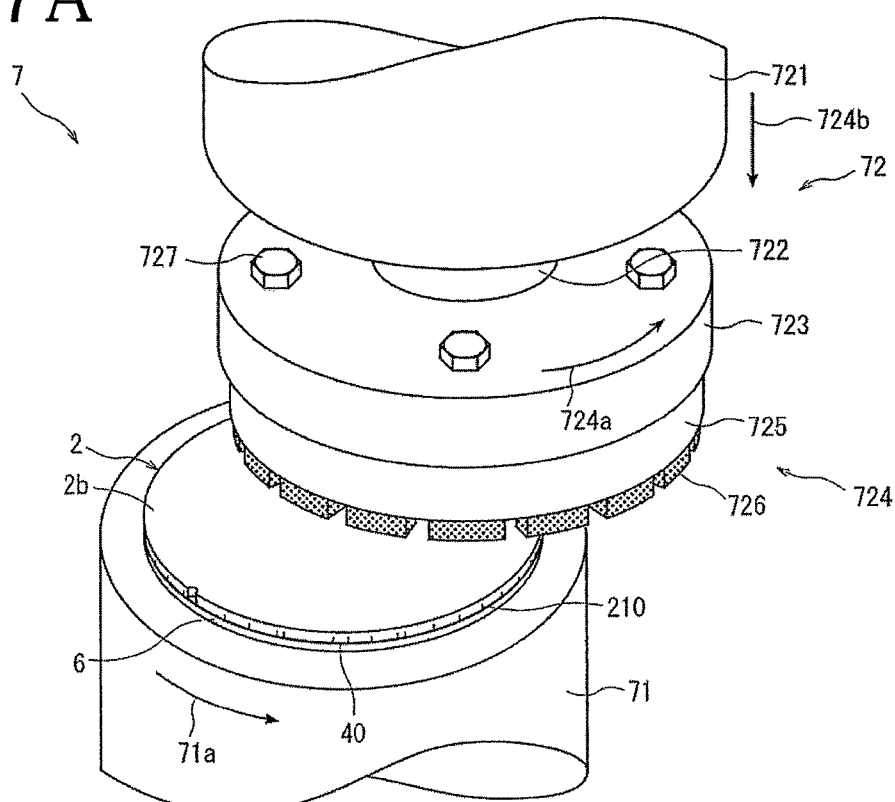
FIGS. 7A to 7C are views for illustrating a back grinding step.
Figure 7B:
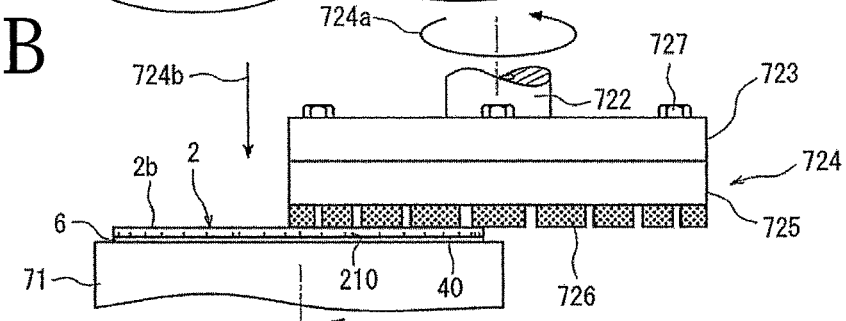
Figure 7C:
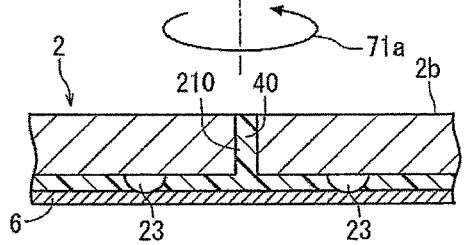

In performing the back grinding step by using the grinding apparatus 7 mentioned above, the semiconductor wafer 2 is placed on the chuck table 71 in the condition where the protective tape 6 attached to the semiconductor wafer 2 is in contact with the upper surface (holding surface) of the chuck table 71 as shown in FIG. 7A. Thereafter, suction means (not shown) is operated to hold the semiconductor wafer 2 through the protective tape 6 on the chuck table 71 under suction. Accordingly, the semiconductor wafer 2 is held through the protective tape 6 on the chuck table 71 under suction in the condition where the back side 2b of the semiconductor wafer 2 is oriented upward. After holding the semiconductor wafer 2 through the protective tape 6 on the chuck table 71 under suction as mentioned above, the chuck table 71 is rotated in the direction of the arrow 71a in FIG. 7A at 300 rpm, for example. At the same time, the grinding wheel 724 of the grinding means 72 is also rotated in the direction shown by an arrow 724a in FIG. 7A at 6000 rpm, for example. Thereafter, the grinding means 72 is lowered to bring the abrasive members 726 of the grinding wheel 724 into contact with the back side 2b (work surface) of the semiconductor wafer 2. Thereafter, the grinding wheel 724 is fed (lowered) in the direction shown by an arrow 724b in FIGS. 7A and 7B (in the direction perpendicular to the holding surface of the chuck table 71) by a predetermined amount at a feed speed of 1 µm/second, for example. As a result, the back side 2b of the semiconductor wafer 2 is ground until the bottom of each groove 210 is exposed to the back side 2b of the semiconductor wafer 2, so that the mold resin 40 filling each groove 210 is exposed to the back side 2b of the semiconductor wafer 2 as shown in FIG. 7C.

Figure 8A:
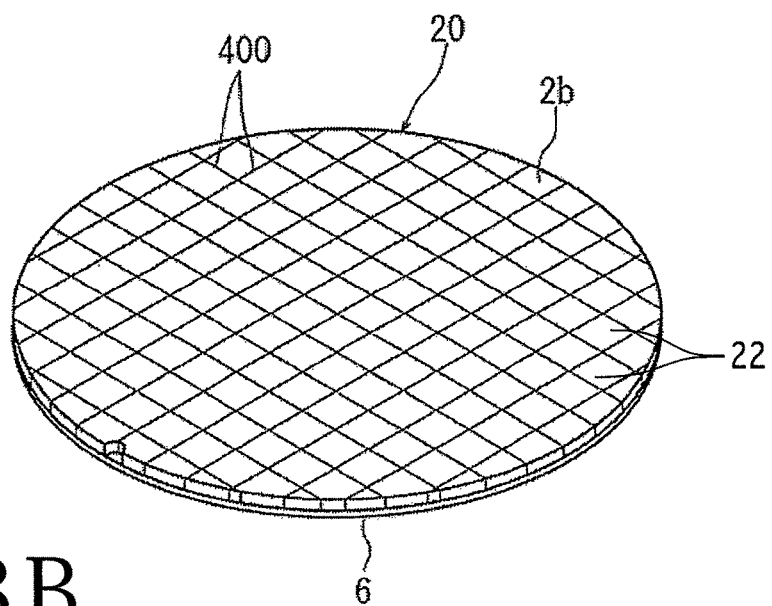
FIG. 8A is a perspective view of a wafer as a workpiece to be processed by the present invention.
Figure 8B:
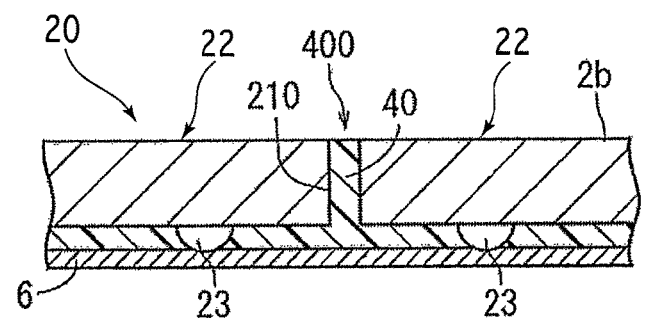
FIG. 8B is an enlarged sectional view of an essential part of the wafer shown in FIG. 8A.

In this manner, the groove forming step, the molding step, the bump exposing step, the protective member attaching step, and the back grinding step are performed to manufacture a wafer 20 shown in FIGS. 8A and 8B, wherein the wafer 20 has the plural devices 22 arranged like a matrix with a spacing (each groove 210) having a predetermined width (e.g., 40 µm), the front side of each device 22 being covered with the mold resin 40, the spacing (each groove 210) being filled with the mold resin 40 to form a street 400 between any adjacent ones of the plural devices 22.

There is another method of manufacturing such a wafer having a plurality of devices arranged like a matrix with a spacing having a predetermined width, the front side of each device being covered with a mold resin, the spacing being filled with the mold resin to form a street between any adjacent ones of the plural devices. This method includes the steps of providing a ring on a predetermined substrate, arranging a plurality of individual devices previously divided on the substrate inside the ring in the condition where the front side of each device is oriented upward and a spacing having a predetermined width is defined between any adjacent ones of the plural devices, and applying a mold resin to the front side of each device so as to fully cover the front side of each device with the mold resin and fill the spacing with the mold resin.

Figure 9:
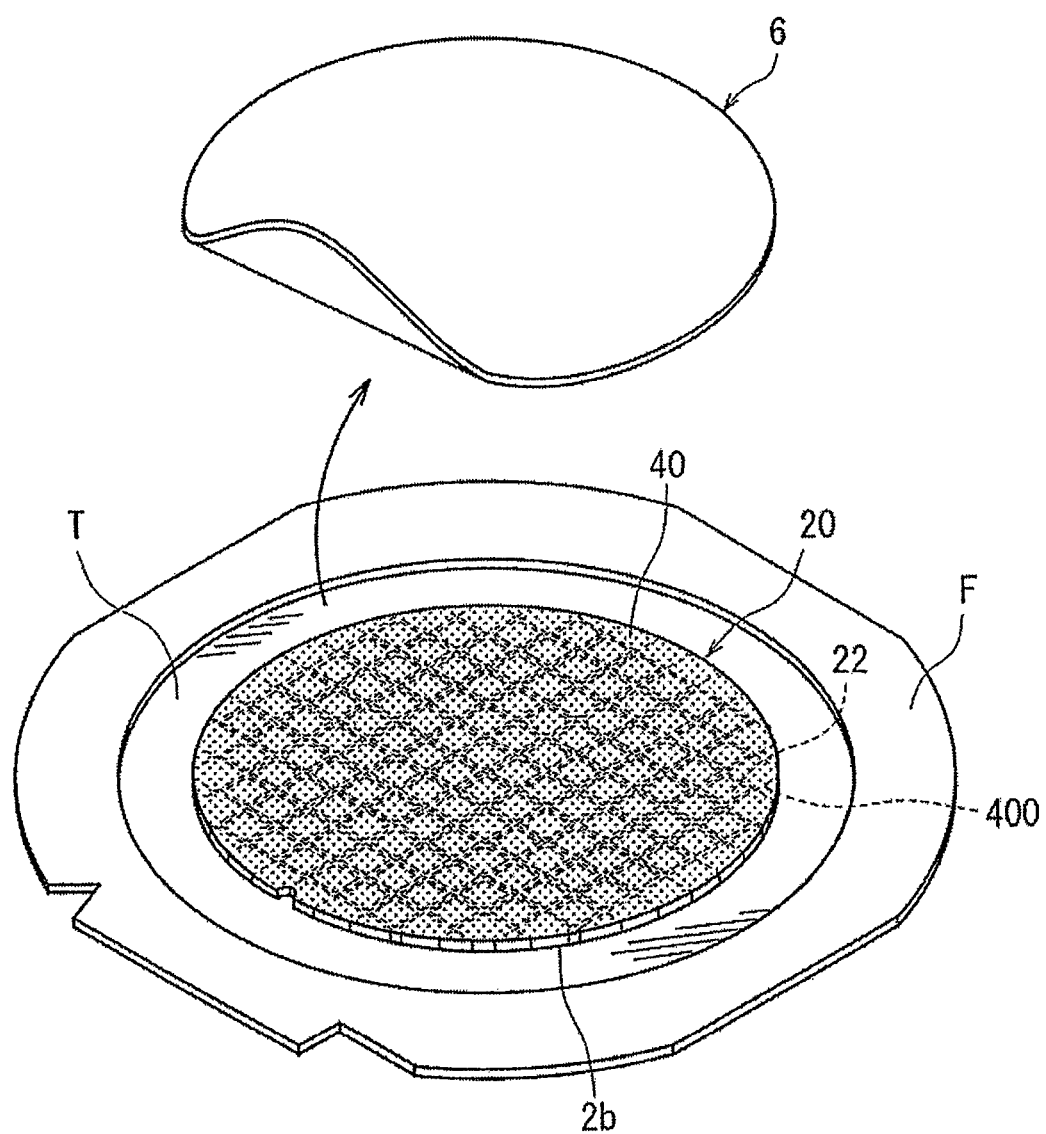
FIG. 9 is a perspective view for illustrating a wafer supporting step.

There will now be described a method of dividing the wafer manufactured above into the devices surrounded by the mold resin. In the following description, the wafer 20 shown in FIGS. 8A and 8B is used as the wafer to be divided. In the case of dividing the wafer 20 shown in FIGS. 8A and 8B into the devices 22 surrounded by the mold resin 40, a wafer supporting step is first performed in such a manner that a dicing tape is attached to the back side of the wafer 20 and the protective tape 6 as the protective member is peeled from the front side of the mold resin 40 covering the front side of the wafer 20. More specifically, as shown in FIG. 9, a dicing tape T is previously supported at its peripheral portion to an annular frame F in such a manner that the inside opening of the annular frame F is closed by the dicing tape T. The back side 2b of the wafer 20 is attached to the front side of the dicing tape T at its central portion. Thereafter, the protective tape 6 is peeled from the front side of the mold resin 40 covering the front side of the wafer 20. Accordingly, the wafer 20 is attached to the front side of the dicing tape T in the condition where the mold resin 40 is oriented upward.

Figure 2:
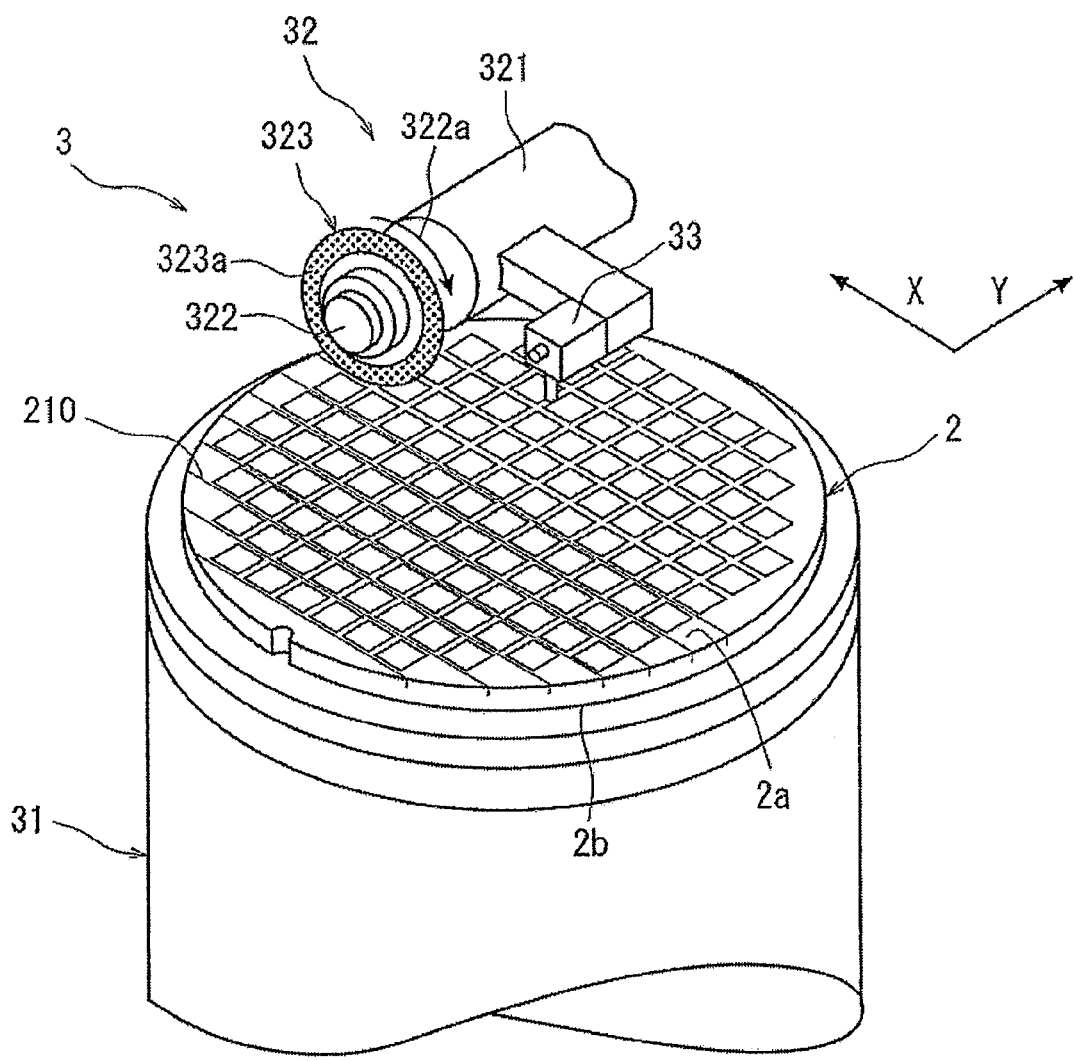
FIG. 2 is a perspective view showing an essential part of a cutting apparatus for performing a groove forming step.

After performing the wafer supporting step mentioned above, a division start point forming step is performed in such a manner that a division start point is formed along each street 400 at the lateral center of the mold resin 40 filling the spacing (each groove 210) of the wafer 20 shown in FIGS. 8A and 8B. A first preferred embodiment of this division start point forming step is performed by using a cutting apparatus 30 shown in FIG. 10A. The cutting apparatus 30 shown in FIG. 10A has the same configuration as that of the cutting apparatus 3 shown in FIG. 2 except the annular cutting edge 323a of the cutting blade 323. Accordingly, the same parts as those shown in FIG. 2 are denoted by the same reference symbols, and the description thereof will be omitted herein. The cutting apparatus 30 shown in FIG. 10A includes a cutting blade 323 having an annular cutting edge 323b. As shown in FIG. 10B, the outer circumferential portion of the annular cutting edge 323b has a V-shaped cross section. The wafer to be processed by the division start point forming step is the wafer 20 shown in FIGS. 8A and 8B.

Figure 10A:
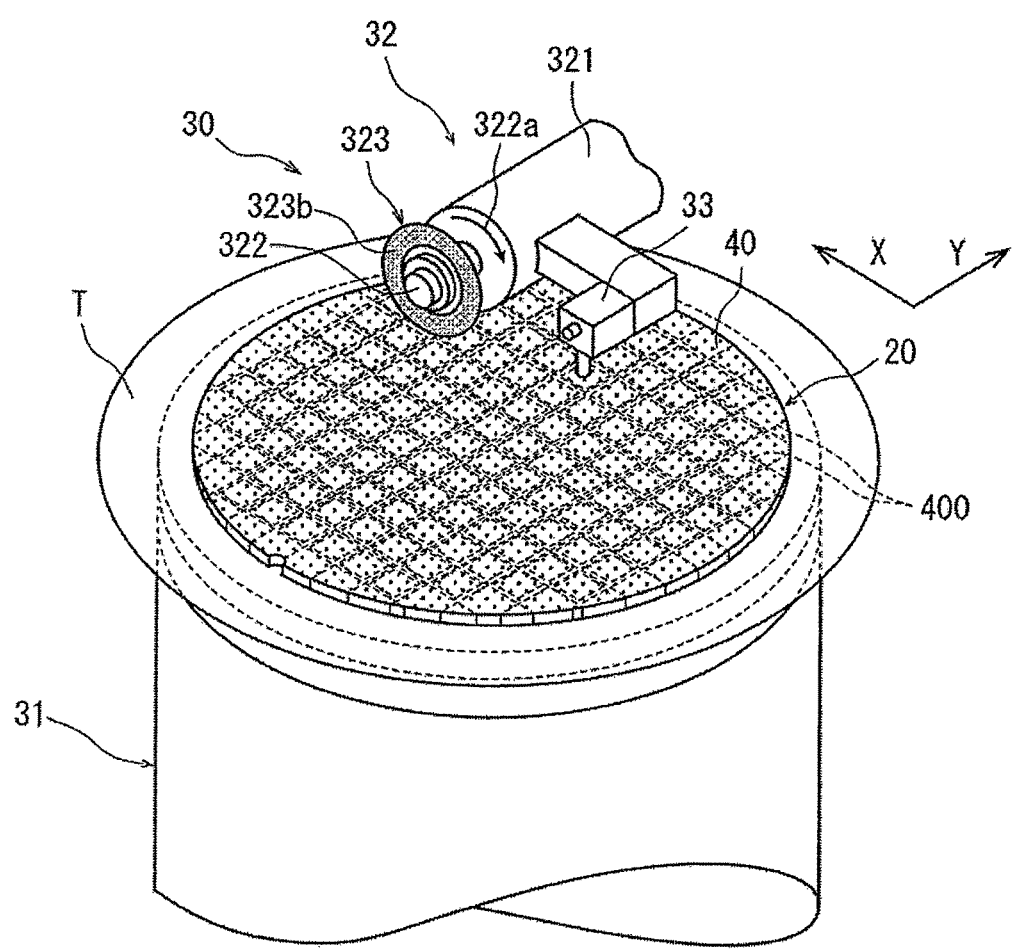
FIG. 10A is a perspective view showing an essential part of a cutting apparatus for performing a first preferred embodiment of a division start point forming step.
Figure 10B:
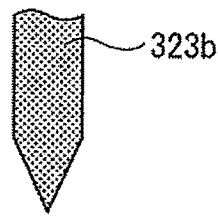
FIG. 10B is an enlarged sectional view of an essential part of a cutting blade included in the cutting apparatus shown in FIG. 10A.

In performing the division start point forming step to the wafer 20 shown in FIGS. 8A and 8B by using the cutting apparatus 30 shown in FIG. 10A, the wafer 20 is placed on the chuck table 31 in the condition where the dicing tape T attached to the back side 2b of the wafer 20 is in contact with the upper surface of the chuck table 31. Thereafter, suction means (not shown) is operated to hold the wafer 20 through the dicing tape T on the chuck table 31 under suction. Accordingly, the wafer 20 is held on the chuck table 31 in the condition where the mold resin 40 covering the front side of the wafer 20 is oriented upward. After holding the wafer 20 on the chuck table 31 under suction as described above, the chuck table 31 is moved to a position directly below the imaging means 33 by operating the feeding means (not shown).

In the condition where the chuck table 31 holding the wafer 20 is positioned directly below the imaging means 33, an alignment operation is performed by the imaging means 33 and the control means (not shown) to detect a cutting area where a cut groove as the division start point is to be formed along each street 400 on the front side of the mold resin 40 filling the spacing (each groove 210) of the wafer 20. More specifically, the imaging means 33 and the control means (not shown) perform image processing such as pattern matching for making the alignment between the streets 400 extending in a first direction on the wafer 20 and the cutting blade 323 for cutting the wafer 20 along the streets 400, thereby performing the alignment for the cutting area (alignment step). Since the mold resin 40 is present on the front side of the wafer 20 having the spacing (each groove 210), the imaging means 33 is operated to image the bumps 23 of the adjacent devices 22, the bumps 23 being exposed to the front side of the mold resin 40. An image signal output from the imaging means 33 is then transmitted to the control means. The control means decides that the intermediate position between the bumps 23 of the adjacent devices 22 is the lateral center of the spacing (each groove 210). After performing the alignment for the streets 400 extending in the first direction, the alignment step is similarly performed for the other streets 400 extending in a second direction perpendicular to the first direction on the wafer 20.

After performing the alignment step to detect all of the streets 400 of the wafer 20 held on the chuck table 31, the chuck table 31 holding the wafer 20 is moved to a cutting start position in the cutting area. At the cutting start position, one end (left end as viewed in FIG. 11A) of a predetermined one of the streets 400 extending in the first direction is set on the right side of a position directly below the annular cutting edge 323b of the cutting blade 323 by a predetermined amount as shown in FIG. 11A.

After setting the wafer 20 at the cutting start position as described above, the cutting blade 323 is lowered as shown by an arrow Z1 from a standby position shown by a phantom line in FIG. 11A to a working position shown by a solid line in FIG. 11A. As shown in FIG. 11C, this working position is set so that the lower end of the annular cutting edge 323b of the cutting blade 323 is positioned at a depth of 50 μm, for example, from the front side of the mold resin 40 covering the front side of the wafer 20.

Thereafter, the cutting blade 323 is rotated at a predetermined speed in the direction of the arrow 322a shown in FIG. 11A, and the chuck table 31 is moved at a predetermined feed speed in the direction shown by an arrow X1 in FIG. 11A. When the other end (right end as viewed in FIG. 11B) of the predetermined street 400 reaches the left side of the position directly below the annular cutting edge 323b of the cutting blade 323 by a predetermined amount as shown in FIG. 11B, the movement of the chuck table 31 is stopped. By feeding the chuck table 31 as rotating the cutting blade 323 in this manner, the front side of the mold resin 40 covering the front side of the wafer 20 is cut along the predetermined street 400 at the lateral center of the spacing (each groove 210) to form a V-shaped cut groove 401 having a depth of 50 μm as the division start point on the front side of the mold resin 40 along the predetermined street 400 as shown in FIG. 11D.

Thereafter, the cutting blade 323 is raised as shown by an arrow Z2 from the working position shown by a solid line in FIG. 11B to the standby position shown by a phantom line in FIG. 11B, and the chuck table 31 is next moved in the direction shown by an arrow X2 in FIG. 11B to restore the position shown in FIG. 11A. Thereafter, the chuck table 31 is indexed in the direction (indexing direction) perpendicular to the sheet plane of FIG. 11A by an amount corresponding to the pitch of the streets 400, thereby positioning the next street 400 in alignment with the cutting blade 323. In the condition where the next street 400 is aligned with the cutting blade 323, the division start point forming step mentioned above is performed along the next street 400. Thereafter, the division start point forming step mentioned above is similarly performed along all of the other streets 400 extending in the first direction. Thereafter, the chuck table 31 is rotated 90 degrees to similarly perform the division start point forming step along all of the streets 400 extending in the second direction perpendicular to the first direction. As a result, a plurality of V-shaped cut grooves 401 are formed along all of the streets 400 extending in the first and second directions.

A second preferred embodiment of the division start point forming step will now be described with reference to FIGS. 12A to 12D. The second preferred embodiment of the division start point forming step is performed by using a scribing apparatus 8 shown in FIGS. 12A and 12B. The scribing apparatus 8 includes a chuck table 81 for holding the wafer 20 and a scriber 82 for scribing the wafer 20 held on the chuck table 81. First, the wafer 20 is placed on the chuck table 81 in the condition where the dicing tape T attached to the back side 2b of the wafer 20 is in contact with the upper surface of the chuck table 81. Thereafter, suction means (not shown) is operated to hold the wafer 20 through the dicing tape T on the chuck table 81 under suction. Accordingly, the wafer 20 is held on the chuck table 81 in the condition where the mold resin 40 covering the front side of the wafer 20 is oriented upward. Thereafter, an alignment operation is performed to detect a scribing area where a scribed groove as the division start point is to be formed along each street 400 on the front side of the mold resin 40 filling the spacing (each groove 210) of the wafer 20. This alignment operation is similar to that performed in the first preferred embodiment mentioned above.

After performing the alignment operation, the chuck table 81 holding the wafer 20 is moved to a scribing start position in the scribing area. At the scribing start position, one end (left end as viewed in FIG. 12A) of a predetermined one of the streets 400 extending in the first direction is set on the right side of a position directly below the scriber 82 by a predetermined amount as shown in FIG. 12A.

Figure 12A:
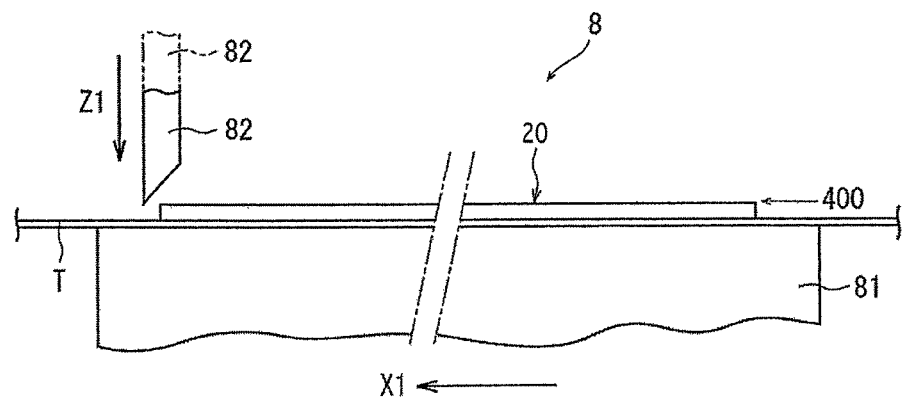
FIGS. 12A to 12D are views for illustrating a second preferred embodiment of the division start point forming step.
Figure 12B:
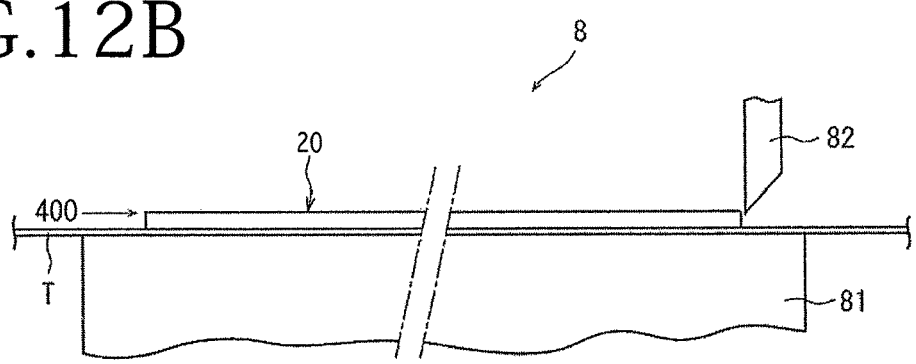
Figure 12C:
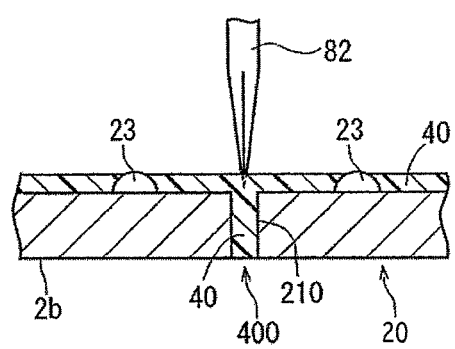

After setting the wafer 20 at the scribing start position as described above, the scriber 82 is lowered as shown by an arrow Z1 from a standby position shown by a phantom line in FIG. 12A to a working position shown by a solid line in FIG. 12A. As shown in FIG. 12C, this working position is set so that the lower end of the scriber 82 is positioned at a depth of 50 μm, for example, from the front side of the mold resin 40 covering the front side of the wafer 20.

Figure 12D:
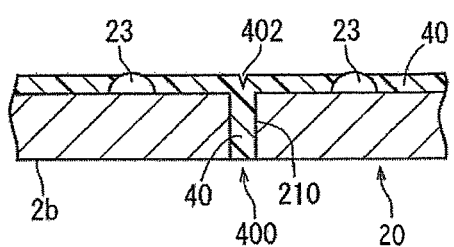

Thereafter, the chuck table 81 holding the wafer 20 is moved at a predetermined feed speed in the direction shown by an arrow X1 in FIG. 12A. When the other end (right end as viewed in FIG. 12B) of the predetermined street 400 reaches the left side of the position directly below the scriber 82 by a predetermined amount as shown in FIG. 12B, the movement of the chuck table 81 is stopped. By feeding the chuck table 81 in this manner, the front side of the mold resin 40 covering the front side of the wafer 20 is scribed along the predetermined street 400 at the lateral center of the spacing (each groove 210) to form a V-shaped scribed groove 402 having a depth of 50 μm as the division start point on the front side of the mold resin 40 along the predetermined street 400 as shown in FIG. 12D. This division start point forming step is similarly performed along all of the other streets 400 extending in the first direction and in the second direction perpendicular to the first direction. As a result, a plurality of V-shaped scribed grooves 402 are formed along all of the streets 400.

A third preferred embodiment of the division start point forming step will now be described with reference to FIGS. 13A to 13D. The third preferred embodiment of the division start point forming step is performed by using a laser processing apparatus 9 shown in FIGS. 13A and 13B. The laser processing apparatus 9 includes a chuck table 91 for holding the wafer 20 and laser beam applying means 92 having focusing means 922 for applying a pulsed laser beam to the wafer 20. First, the wafer 20 is placed on the chuck table 91 in the condition where the dicing tape T attached to the back side 2b of the wafer 20 is in contact with the upper surface of the chuck table 91. Thereafter, suction means (not shown) is operated to hold the wafer 20 through the dicing tape T on the chuck table 91 under suction. Accordingly, the wafer 20 is held on the chuck table 91 in the condition where the mold resin 40 covering the front side of the wafer 20 is oriented upward. Thereafter, an alignment operation is per-formed to detect a processing area where a laser processed groove as the division start point is to be formed along each street 400 on the front side of the mold resin 40 filling the spacing (each groove 210) of the wafer 20. This alignment operation is similar to that performed in the first and second preferred embodiments mentioned above.

Figure 13A:
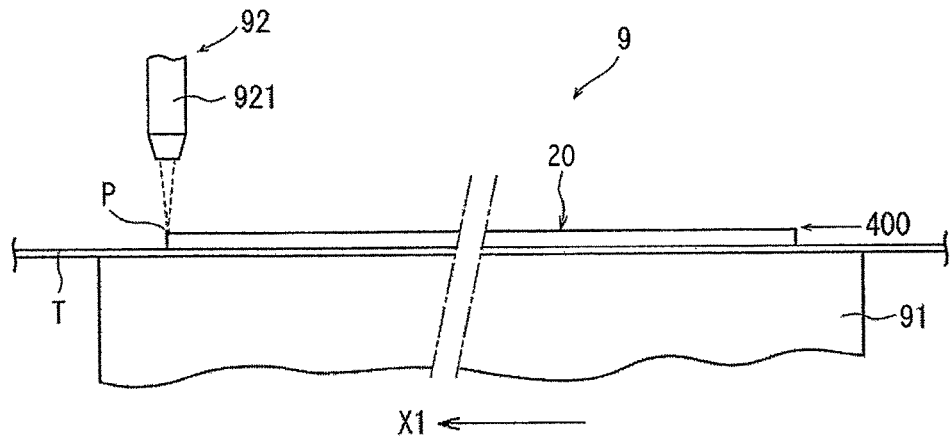
FIGS. 13A to 13D are views for illustrating a third preferred embodiment of the division start point forming step.
Figure 13B:
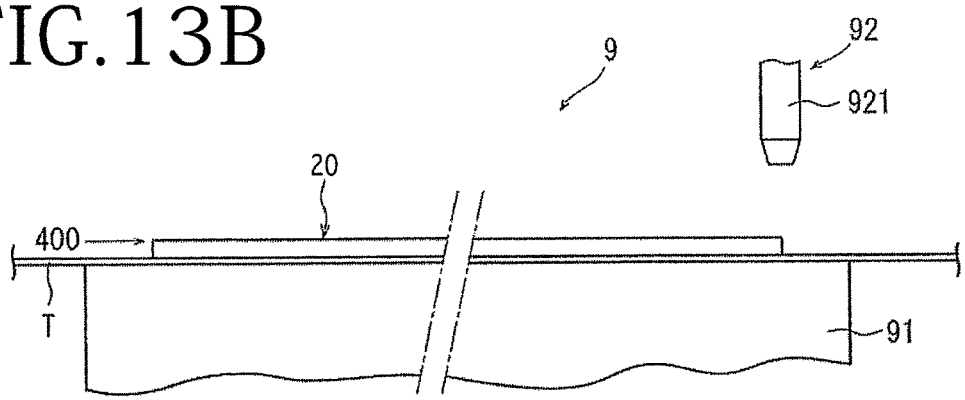
Figure 13C:
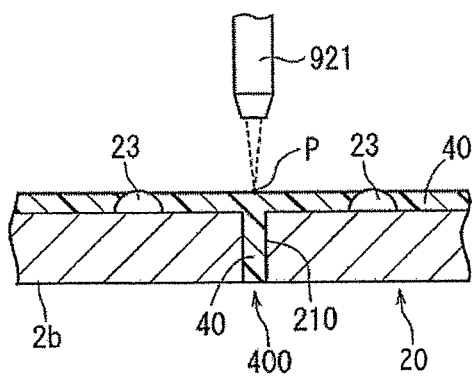

After performing the alignment operation, the chuck table 91 holding the wafer 20 is moved to a processing start position in the processing area. At the processing start position, one end (left end as viewed in FIG. 13A) of a predetermined one of the streets 400 extending in the first direction is set at a position directly below the focusing means 921 as shown in FIG. 13A, and the lateral center of the spacing (each groove 210) of the predetermined street 400 is set at this position directly below the focusing means 921 as shown in FIG. 13C. Further, the focal point P of the pulsed laser beam to be applied from the focusing means 921 is set near the upper surface (front side) of the mold resin 40 covering the front side of the wafer 20 as shown in FIG. 13C. In this preferred embodiment, the focused spot diameter of the pulsed laser beam to be applied from the focusing means 921 is set to 10 μm. The pulsed laser beam has an absorption wavelength to the mold resin 40.

Figure 13D:
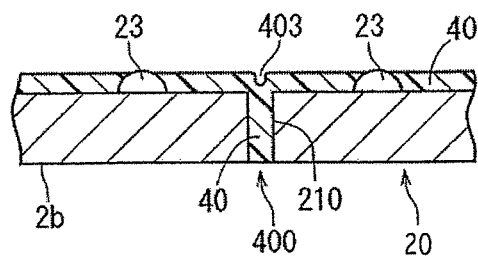

Thereafter, the pulsed laser beam is applied from the focusing means 921 to the mold resin 40. At the same time, the chuck table 91 holding the wafer 20 is moved at a predetermined feed speed in the direction shown by an arrow X1 in FIG. 13A. When the other end (right end as viewed in FIG. 13B) of the predetermined street 400 reaches the position directly below the focusing means 921 as shown in FIG. 13B, the application of the pulsed laser beam is stopped and the movement of the chuck table 91 is also stopped. As a result, the front side of the mold resin 40 covering the front side of the wafer 20 is laser-processed along the predetermined street 400 at the lateral center of the spacing (each groove 210) to form a laser processed groove 403 as the division start point on the front side of the mold resin 40 along the predetermined street 400 as shown in FIG. 13D. This division start point forming step is similarly performed along all of the other streets 400 extending in the first direction and in the second direction perpendicular to the first direction. As a result, a plurality of laser processed grooves 403 are formed along all of the streets 400.

Figure 14A:
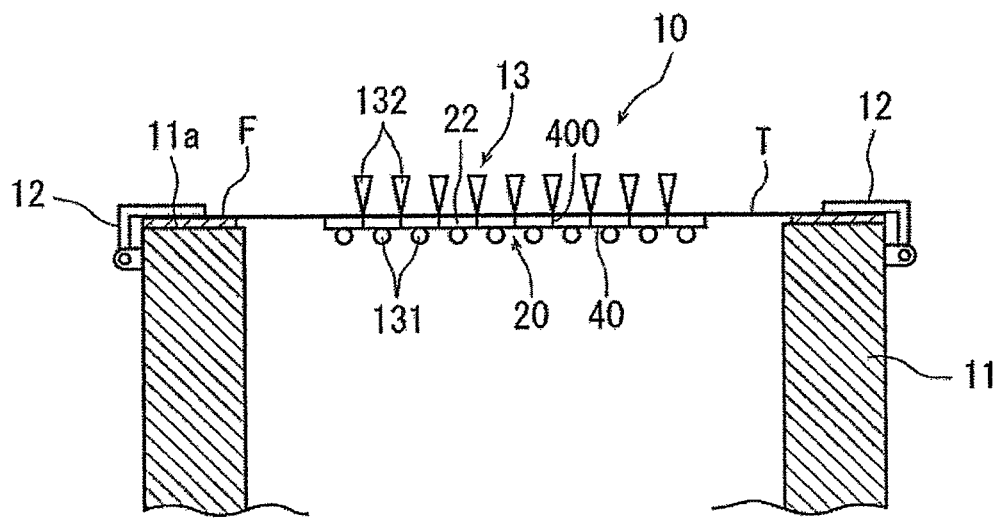
FIGS. 14A to 14C are views for illustrating a dividing step.
Figure 14B:
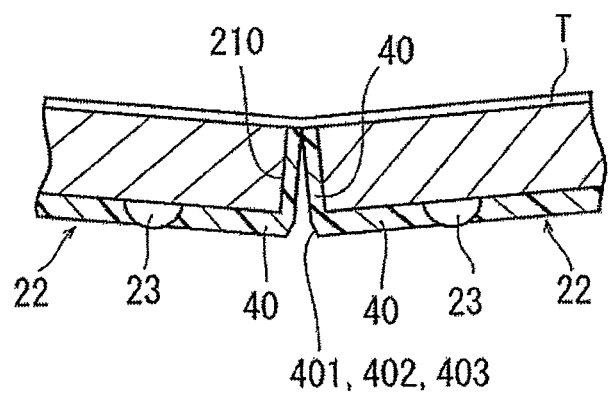

After performing the division start point forming step as described above, a dividing step is performed in such a manner that an external force is applied to the wafer 20 to laterally divide each street 400 into two parts at the division start point, thereby obtaining the individual devices 22 as chips divided from each other, each device 22 being surrounded by the mold resin 40. This dividing step is performed by using a dividing apparatus 10 shown in FIG. 14A. The dividing apparatus 10 includes a cylindrical base 11 having a mounting surface 11a for mounting the annular frame F, a plurality of clamps 12 provided on the outer circumference of the cylindrical base 11 for clamping the annular frame F, and bending load applying means 13 for applying a bending load to the wafer 20. The bending load applying means 13 includes a plurality of rod-like parallel support members 131 for supporting the wafer 20 and a plurality of wedge-shaped parallel pressing members 132 for pressing the wafer 20. First, the annular frame F supporting the wafer 20 through the dicing tape T is mounted on the mounting surface 11a of the cylindrical base 11 in the condition where the dicing tape T is oriented upward as shown in FIG. 14A. Further, the annular frame F is clamped by the clamps 12. In this condition, the mold resin 40 covering the front side of the wafer 20 is oriented downward, and the mold resin 40 is mounted on the plural support members 131 of the bending load applying means 13 in such a manner that each street 400 extending in the first direction is positioned between any adjacent ones of the plural support members 131, wherein each street 400 is formed with the V-shaped cut groove 401, the scribed groove 402, or the laser processed groove 403. Thereafter, the plural pressing members 132 are lowered to press the wafer 20 from the upper side thereof, i.e., from the dicing tape T side, along the streets 400 extending in the first direction. As a result, a bending load is applied to the wafer 20 along each street 400 extending in the first direction, so that a tensile stress is generated at the V-shaped cut groove 401, the scribed groove 402, or the laser processed groove 403 formed along each street 400. As a result, the mold resin 40 filling the spacing (each groove 210) of the wafer 20 is divided along each street 400 at the V-shaped cut groove 401, the scribed groove 402, or the laser processed groove 403 as the division start point as shown in FIG. 14B.

Figure 14C:
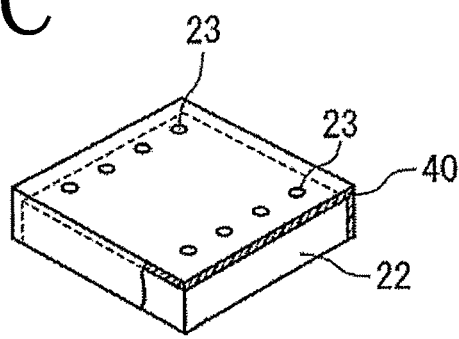

After dividing the wafer 20 along each street 400 extending in the first direction, the cylindrical base 11 is rotated 90 degrees to similarly divide the wafer 20 along each street 400 extending in the second direction perpendicular to the first direction. As a result, the wafer 20 is divided into the individual devices 22, wherein the front side (upper surface) and the side surface of each device 22 are covered with the mold resin 40 as shown in FIG. 14C. These individual devices 22 divided from each other are maintained in the form of the wafer 20 because the back side of each device 22 is attached to the dicing tape T. As shown in FIG. 14C, the front side (upper surface) and the side surface of each device 22 are covered with the mold resin 40 to obtain a WLCSP.

As described above, the wafer processing method according to this preferred embodiment includes the division start point forming step of forming the V-shaped cut groove 401, the scribed groove 402, or the laser processed groove 403 as the division start point along each street 400 at the lateral center of the mold resin 40 filling the spacing (each groove 210) of the wafer 20 and also includes the dividing step of applying an external force to the wafer 20 after performing the division start point forming step, thereby laterally dividing each street 400 into two parts at the V-shaped cut groove 401, the scribed groove 402, or the laser processed groove 403 as the division start point to obtain the individual devices 22 as chips divided from each other, each device 22 being surrounded by the mold resin 40. Accordingly, a cutting blade is not used to divide the wafer 20 along each street 400 at the lateral center of the mold resin 40 filling the spacing of the wafer 20. As a result, it is possible to solve the problem that the cutting edge of the cutting blade may be deformed to cause damage to the side surface of each device 22 in cutting the mold resin 40.

While the division start point is formed on the front side of the wafer 20 in the above preferred embodiment, the division start point may be formed on the back side of the wafer 20 along each street 400 where the mold resin 40 is exposed, after performing the back grinding step and before performing the wafer supporting step.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for manufacturing and dividing a wafer having a plurality of devices arranged like a matrix with a spacing having a predetermined width, said spacing being filled with said mold resin to form a street between any adjacent ones of said devices, said wafer manufacturinq and dividing method comprising:
    an original wafer preparing step of preparing an original wafer having a front side on which a plurality of crossing division lines are formed to thereby define a plurality of separate regions where said devices are each formed;
    a groove forming step of forming a groove having a depth corresponding to the finished thickness of each device chip on the front side of said original wafer along each division line, after performing said original wafer preparing step;
    a molding step of applying mold resin to the front side of said original wafer so as to fully cover the front side and fill said groove formed on the front side along each division line, after performing said groove forming step;
    a back grinding step of grinding the back side of said original wafer after performing said molding step, thereby exposing the bottom of each groove to expose said mold resin filling each groove to the back side of said original wafer;
    a division start point forming step of forming a division start point along each street at the lateral center of said mold resin filling said spacing; and
    a dividing step of applying an external force to said wafer after performing said division start point forming step, thereby laterally dividing each street into two parts at said division start point to obtain said device chips divided from each other, each device chip being surrounded by said mold resin.

2. The wafer processing method according to claim 1, wherein said division start point to be formed in said division start point forming step includes a cut groove to be formed by a cutting blade.

3. The wafer processing method according to claim 1, wherein said division start point to be formed in said division start point forming step includes a scribed groove to be formed by a scriber.

4. The wafer processing method according to claim 1, wherein said division start point to be formed in said division start point forming step includes a laser processed groove to be formed by laser processing.

* * * * *